(12) United States Patent
Choi et al.

(10) Patent No.: US 7,964,478 B2
(45) Date of Patent: Jun. 21, 2011

(54) GROUP III NITRIDE COMPOUND SEMICONDUCTOR DEVICE

(75) Inventors: Jae Bin Choi, Ansan-si (KR); Hong Jae Yoo, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/748,840

(22) Filed: Mar. 29, 2010

(65) Prior Publication Data

US 2010/0184273 A1    Jul. 22, 2010

Related U.S. Application Data

(62) Division of application No. 12/212,254, filed on Sep. 17, 2008, now Pat. No. 7,915,147.

(60) Provisional application No. 60/974,336, filed on Sep. 21, 2007.

(51) Int. Cl.
*H01L 21/20* (2006.01)
*H01L 21/36* (2006.01)

(52) U.S. Cl. .................. 438/478; 257/E21.09

(58) Field of Classification Search .................. 438/478; 257/E21.09
See application file for complete search history.

(56) References Cited

U.S. PATENT DOCUMENTS 7,550,782 B2    6/2009  Murakami et al.

FOREIGN PATENT DOCUMENTS

JP    2000-77712    3/2000

OTHER PUBLICATIONS

Katz et al., "The influence of ammonia on rapid-thermal low-pressure metalorganic chemical vapor deposited TiNx films from tetrakis (dimethylamido) titanium precursor onto InP", Journal of Applied Physics, vol. 71, No. 2, 1992, pp. 993-1000.*
Ivanovskii et al. "Electronic Structure and Bonding Configuration of the H-Phases Ti2MC and Ti2MN (M=Al, Ga, In)", Inorganic Materials, vol. 36, No. 1, 2000 pp. 35-38.
Non-Final Office Action issued Jun. 1, 2010 in U.S. Appl. No. 12/212,254.
Notice of Allowance and Fee(s) Due dated Nov. 2, 2010 issued in co-pending U.S. Appl. No. 12/212,254.

* cited by examiner

*Primary Examiner* — Matthew C Landau
*Assistant Examiner* — Sonya D McCall Shepard
(74) *Attorney, Agent, or Firm* — H.C. Park & Associates, PLC

(57) ABSTRACT

Disclosed is a group III nitride compound semiconductor device having a substrate, buffer layers on the substrate, and a group III nitride compound semiconductor layer on the top layer of the buffer layers. The buffer layers comprises a first buffer layer formed on the substrate and a second buffer layer formed on the first buffer layer. The first buffer layer is made of transition metal nitride, and the second buffer layer is made of nitride of gallium and a transition metal.

17 Claims, 4 Drawing Sheets

(A)

(B)

GROUP III NITRIDE COMPOUND SEMICONDUCTOR DEVICE

CROSS REFERENCE TO RELATED APPLICATIONS

This application is a divisional of U.S. patent application Ser. No. 12/212,254, filed on Sep. 17, 2008, and claims the benefit of U.S. Provisional Application No. 60/974,336, filed on Sep. 21, 2007, which are hereby incorporated by reference for all purposes as if fully set forth herein.

FIELD OF THE INVENTION

The present invention relates to fields of semiconductors. More specifically, the present invention relates to a group III nitride compound semiconductor device that is adapted for blue and green light emitting optoelectronic devices.

DISCUSSION OF THE BACKGROUND

Group III nitrides provide the important advantage of having a strong chemical bond which makes them highly stable and resistant to degradation under high electric current and intense light illumination conditions that are present at the active regions of optoelectronic devices. These materials are also resistant to dislocation formation once grown.

Due to the high growth temperatures of group III nitrides, there are presently only a limited number of known substrates suitable for supporting nitride film growth. The most commonly used substrate materials are sapphire and silicon carbide. These materials have significantly different lattice parameters and thermal expansion coefficients than the group III nitrides. Consequently, the interfaces formed between the substrates and nitrides lack coherence, resulting in increased interface strain and interface energy, and diminished film wetting. These factors largely affect the nitride film growth process and the quality of the resulting nitride films. For example, the growth process of group III nitrides on sapphire using known processes is highly three-dimensional. Group III nitride film growth occurs initially by the formation of discrete three-dimensional nitride islands on the substrate. These islands grow and coalesce with each other. Lattice matching is poor at the regions of the film at which the islands coalesce. High dislocation densities are generated at these regions. Dislocation arrays in the nitride film adversely affect the optoelectronic properties of devices fabricated on the nitride films by affecting carrier recombination processes in the active regions of the devices, and ultimately reducing emitted light intensities and device efficiencies.

Recently, many developers even seek new nitride platform with no immediate bulk GaN on the commercial horizon, and some engineers have started to look beyond silicon and SiC to composite materials and metals as a platform for nitride growth.

Of the many composite materials and metals as a candidate for new nitride platform, an increasing interest on TiN material has started to emerge. In general, a thin film of TiN has many purposes covering from mechanical hard-coating including military application, aerospace industry up to electronic, bio-material area due to outstanding chemical, mechanical, thermal stability. Though less visible, thin film TiN may also be used in the semiconductor industry. In copper-based chips, such films find use as a conductive barrier between a silicon device and the metal contacts used to operate it. While the film blocks diffusion of metal into the silicon, it is conductive enough (30-70 $\mu\Omega\cdot$cm) to allow a good electrical connection.

Nevertheless, little work to import transition metal nitride such as TiN-like material to be used for production of group III nitride compound semiconductor device has been conducted and to date, the growth method how to form TiN or co-deposit like a (Ti,Ga)N material on sapphire substrate with or without patterned shape for the purpose of optoelectronics application is not well established.

SUMMARY OF THE INVENTION

Two-dimensional growth of Group III nitride films on substrates is desirable to reduce the dislocation densities in the films. In known processes, however, two-dimensional growth is inhibited by the high interface energy between the substrates and the films. Two-dimensional growth begins only after the islands coalesce and dislocations form.

GaN and related compounds have successfully penetrated the market place in terms of light emitting devices, and to a lesser extent light detecting devices. However, the impetus for improved devices as well as bringing high performance electronic devices to the market place is continually driving the GaN technology for improved optical and electronic properties which are severely affected by non-native substrates on which GaN is heteroepitaxially grown. As such, heteroepitaxial GaN has a high density of threading dislocations (TDs) and associated point defects, which either scatter carriers, hamper radiative recombination efficiency or introduce instabilities, and detrimental to the operational lifetime and performance of devices. In response to the TD problem, the epitaxial lateral overgrowth (ELO) technique has been developed and widely used to obtain device-quality GaN epilayers. But, the ELO process requires ex situ photolithographic step (s), the frequency of which depends on how many times the process is repeated in a given structure, which is cumbersome at the very least and increases the cost.

The present invention provides a group III nitride compound semiconductor device which circumvents the drawbacks described above.

The present invention also provides a method for manufacturing a group III nitride compound semiconductor device which circumvents the drawbacks described above.

An aspect of the invention provides a group III nitride compound semiconductor device having a substrate, buffer layers on the substrate, and a group III nitride compound semiconductor layer on the top layer of the buffer layers. The buffer layers comprise a first buffer layer formed on the substrate and a second buffer layer on the first buffer layer. The first buffer layer is made of a transition metal nitride, and the second buffer layer is formed on the first buffer layer, and the second buffer layer is made of nitride of gallium and transition metal.

Preferably, said transition metal comprises at least one element selected from the group consisting of titanium, zirconium, hafnium and tantalum.

Preferably, said group III nitride compound semiconductor device further comprises a third buffer layer interposed between the second buffer layer and the group III nitride compound semiconductor layer, the third buffer layer being made of GaN.

Preferably, said first buffer layer being made of TiN, said second buffer layer being made of (Ti, Ga)N. More preferably, said (Ti, Ga)N comprising $Ti_2GaN$ phase.

Preferably, said first buffer layer has a thickness of 20 to 100 Å, said second buffer layer has a thickness of 50 to 100 Å and said third buffer layer has a thickness of 200 to 300Å.

Preferably, said substrate is made of one selected from the group of sapphire, silicon carbide, gallium nitride, gallium phosphide and gallium arsenide.

Another aspect of the invention provides a method of manufacturing a group III nitride compound semiconductor device having a substrate, buffer layers on the substrate, and a group III nitride compound semiconductor layer on the top layer of the buffer layers. The method comprising steps of: forming a first buffer layer on the substrate, the first buffer layer being made of a transition metal nitride; and forming a second buffer layer on the first buffer layer, the second buffer layer being made of nitride of gallium and transition metal. Preferably, the method comprises step of forming a third buffer layer on the second buffer layer, thus the third buffer layer being interposed between the second buffer layer and the group III nitride compound semiconductor layer, wherein the third buffer layer being made of GaN.

Preferably, said first buffer layer is TiN layer formed by using metal-organic titanium source selected from TDEAT, TDMAT, TTIP and $TiCl_4$.

Preferably, the second buffer layer is (Ti, Ga)N layer formed by using Metal-organic titanium source selected from TDEAT, TDMAT, TTIP and $TiCl_4$ as a titanium source.

One embodiment of the present invention, contrary to conventional methods of forming a single buffer layer on substrate at a low growth temperature, has the new method in situ grown TiN buffer layer and CO-buffer layer including Ti compound as a interlayer between a group III nitride (GaN layer) and substrate of sapphire in a reactor having a higher growth temperature. For optoelectronic field application, this kind of a method or idea regarding forming in situ TiN or TiN compound layers by means of MOCVD technique where Ti, more particularly, comes from metal-organic source was reported.

In general, according to a conventional method, formation of buffer layers on sapphire substrates is known to enhance two-dimensional nucleation of GaN films on the buffer layers. Although this approach has yielded GaN films having improved electrical and luminescent properties, further increasing the degree of atomic ordering at the interfaces between the substrates and GaN films would increase the quality of the GaN films.

Thus, improved group III nitride films grown on substrates are desirable.

Particularly, improved group III nitride films are desired that have reduced dislocation densities and improved electrical properties and can be used in optoelectronic devices to provide enhanced device performance.

The new interlayer like TiN buffer layer, CO-buffer layer including Ti compound between a substrate and a group III nitride layer can play a significant role in controlling the optoelectronic properties in terms of material quality such as the threading dislocation (TD) issue. Moreover, utilizing this invention, optical performance can be enhanced due to TiN's excellent infrared (IR) reflectivity properties, reflecting in a spectrum similar to elemental gold (Au).

This invention provides group III nitride films grown on substrates that have reduced dislocation densities. This invention also provides a method of forming the improved group III nitride films on substrates. The group III nitride films can be used in light emitting devices including LEDs and diode lasers to improve device performance. The improved group III nitride films formed according to this invention can be used in optoelectronic devices to improve device performance.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF ILLUSTRATIVE EMBODIMENTS

Figure 1:
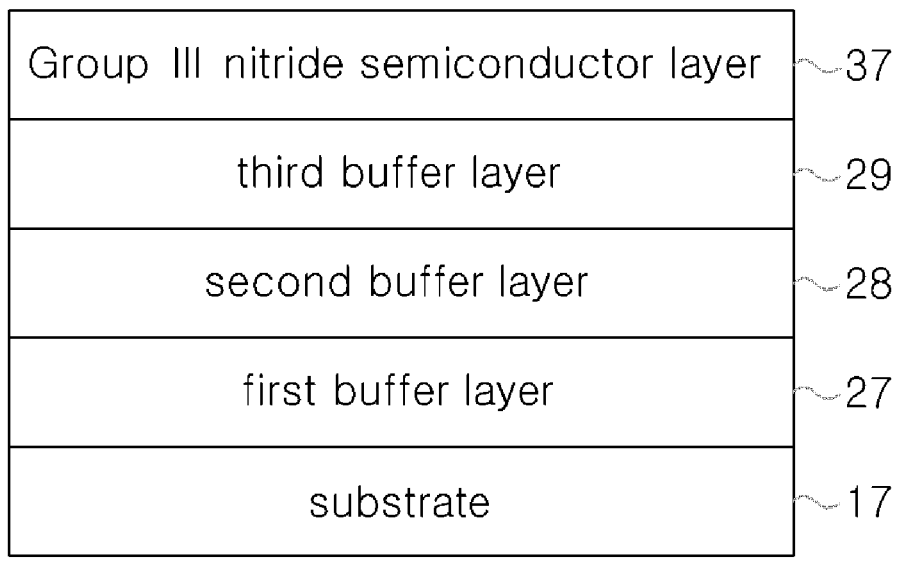
FIG. 1 is a cross-sectional view showing the structure comprising a substrate, a first buffer layer on the substrate, a second buffer layer on the first buffer layer, a third buffer layer on the second buffer layer and a group III nitride film on the third buffer layer, according to an embodiment of this invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 illustrates a cross-sectional view showing the structure comprising a substrate, a first buffer layer on the substrate, a second buffer layer on the first buffer layer, a third buffer layer on the second buffer layer and a group III nitride layer on the third buffer layer, according to an embodiment of this invention.

Referring now to FIG. 1, the substrate 17 can be sapphire, silicon carbide (SiC), Si, gallium nitride, gallium phosphide, zinc oxide (ZnO) or other substrates. Layer 27 is the first buffer layer 27 which is made of titanium nitride where titanium is selected from metal-organic source like TDEAT (tetrakis-diethylamino-titanium, [Ti(NEt$_2$)$_4$]), TDMAT (tetrakis-dimethylamino-titanium, [Ti(NMe$_2$)$_4$], TTIP (titanium isopropoxide, Ti(OC$_3$H$_7$)$_4$) or TiCl$_4$ gas and nitrogen (N) comes from purified nitrogen gas or NH$_3$.

When an LED is produced by use of sapphire as a substrate, luminance is expected to increase because a transition metal nitride has metallic gloss that light emitted from the LED is reflected by a transition metal nitride such as titanium nitride, hafnium nitride, zirconium nitride, tantalum nitride, or the like.

There is also an operation of relaxing distortion (internal stress) caused by the difference in lattice constant or thermal expansion coefficient between the sapphire substrate and each group III nitride compound semiconductor layer because a transition metal nitride like TiN has lower stiffness than sapphire. The method for growing the metal nitride is not particularly limited but examples of the available method include: Chemical Vapor Deposition (CVD) such as plasma CVD, thermal CVD, optical CVD, or the like; Physical Vapor Deposition (PVD) such as sputtering, reactive sputtering, laser ablation, ion plating, evaporation, ECR, or the like; and so on.

The first buffer layer 27 is interposed between the second buffer layer and the substrate. The first buffer layer 27 may be formed on the substrate by a vapor deposition method or by a sputtering method.

Layer 28 is the second buffer layer which is made of a Ti$_x$Ga$_y$ nitride (here, 0<x<10, 0<y<10). After the growth of the first buffer layer 27, TMG (trimethyl-gallium), Ti precursor and ammonia (NH$_3$), respectively in the presence of an inert gas were flowed to substrate or substrate assembly to form (Ti,Ga)N Layer 28 via chemical vapor deposition, more particularly, MOCVD method. For the growth of second buffer layer 28 with a better crystal quality, a relatively higher growth temperature is needed compared to that of third buffer layer 29. Layer 29 is the third buffer layer which has a thickness of about 200~300 Å. The third buffer layer 29 is made of GaN which is formed at a low temperature of 580° C., typically. The growth condition for the third buffer layer 29 is the same as that for the second buffer layer 28 except for only stop flowing Ti precursor and a lower growth temperature of around 580° C.

Figure 2:
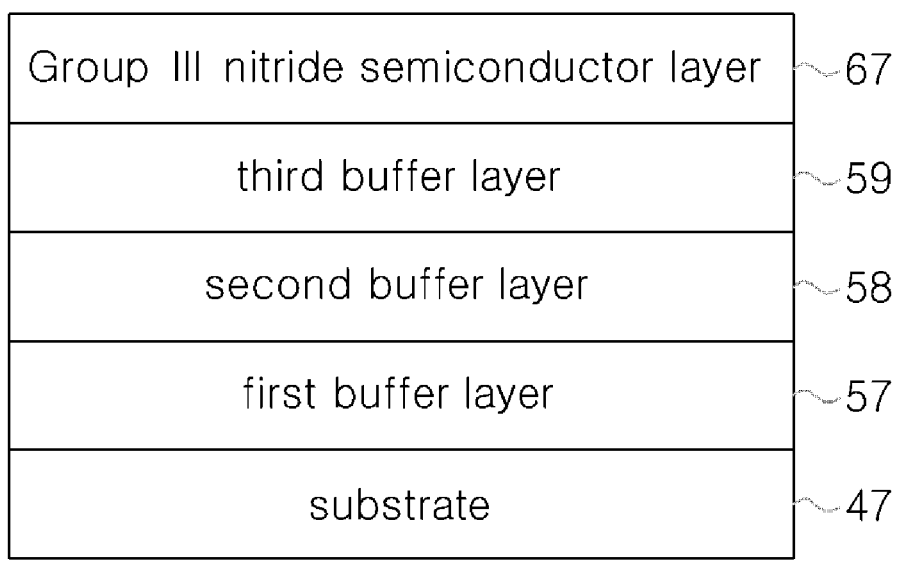
FIG. 2 is a cross-sectional view showing the structure comprising a substrate, a first buffer layer on the substrate, a second buffer layer on the first buffer layer, a third buffer layer on the second buffer layer and a group III nitride film on the third buffer layer, according to another embodiment of this invention.

FIG. 2 is a view showing the configuration of a light-emitting diode according to a second embodiment of the present invention. A group III nitride compound semiconductor device is comprised of the following structure as a substrate, a first buffer layer on the substrate, a second buffer layer on the first buffer layer, a third buffer layer on the second buffer layer, and a group III nitride layer on the third buffer layer.

Referring now to FIG. 2, the substrate can be hexagonal material such as sapphire, SiC (silicon carbide), GaN (gallium nitride), etc. or a cubic material such as Si (silicon), GaP (gallium phosphide), GaAs (gallium arsenide), etc. According to the present embodiment, the substrate is made of sapphire (Al$_2$O$_3$). Moreover, the surface shape of the substrate 47 can be flat or patterned with different crystal orientation.

The first buffer layer 57 which is made of titanium nitride can be formed on the substrate 47 at a relatively high temperature. The optimum growth temperature for obtaining high-quality titanium nitride layer can be determined by process parameters in growth such as gas ambient, kinds of metal-organic source, and growing method. In this invention, the first buffer layer 57 is formed when the temperature of substrate is about 500° C. to about 1,000° C. The formation of the first buffer layer 57 can be conducted in a deposition chamber having a pressure of about 0.1 torr to about 100 torr. The first buffer layer 57 has a thickness of about 20 Å to about 100 Å.

Figure 3:
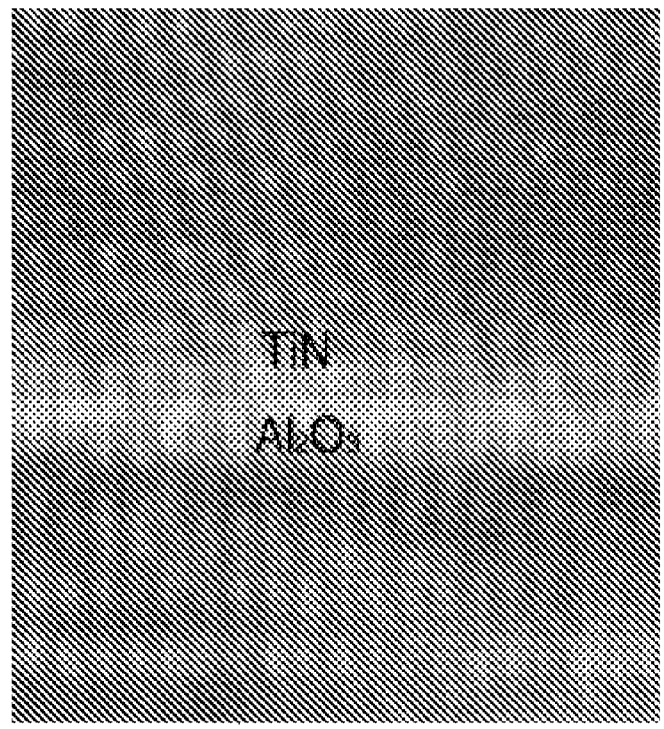
FIG. 3 is a high-resolution image of the interface between epitaxial TiN (111) on $Al_2O_3$ (0001) and Fourier-filtered lattice image processed with the software of Digital Micrograph.
Figure 3:
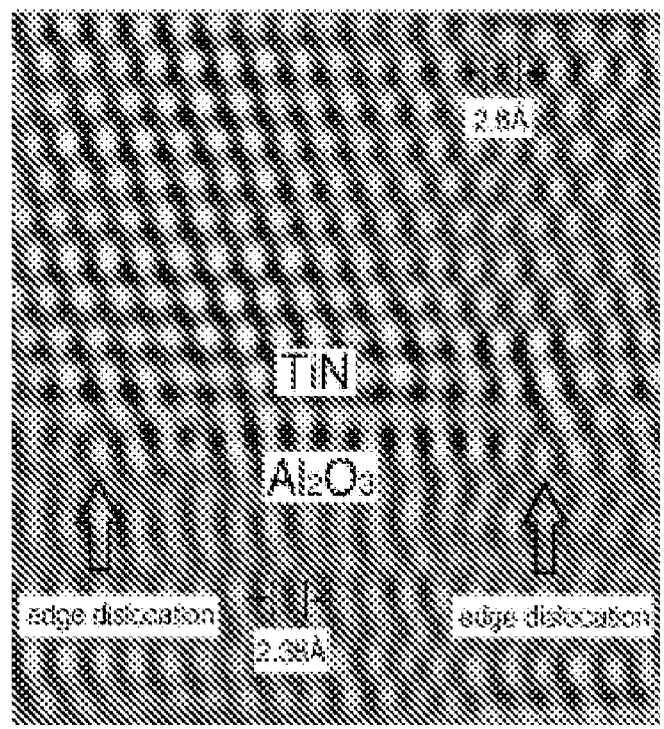

As earlier described, considering the better LED-device quality, little work on using titanium nitride as a interlayer (or a buffer layer) in order to reduce defect generation resulted from hetero-epitaxial growth between a sapphire(Al$_2$O$_3$) substrate and a nitride layer has been reported. The first buffer layer 57 is made of a titanium nitride (111) surface having a rock salt structure. From the FWHM (rocking curve) and theta/2theta scan of X-ray diffraction, the epitaxial relationship on TiN/sapphire (Al$_2$O$_3$) hetero-structure was already confirmed. Besides, there is a report about the narrower FWHM of TiN on sapphire rather than GaN on sapphire (Al$_2$O$_3$) from XRD rocking curve measurement. FIG. 3 shows high-resolution image of the interface between epitaxial TiN (111) on Al$_2$O$_3$ (0001) and Fourier-filtered lattice image processed with the software of Digital Micrograph. Note the extra planes pointed by the arrows. These are misfit dislocations for relieving a lattice mismatch.

After the first buffer layer 57's direct growth on substrate 47, the second buffer layer 58 is formed on the first buffer layer 57 at a temperature of about 500° C. to about 1,000° C., more particularly, around 850° C. The second buffer layer 58 can be composed of (Ti, Ga)N alloys. At a predetermined interval, right after or during formation of second buffer layer 58 on the first buffer layer 57, a spontaneous thermodynamic reaction among Ti, Ga and N (nitrogen) like diffusion can take place for thermodynamic equilibrium of that ternary alloy system. Actually, a basic research of thermal stability on Ti—Ga—N (ternary) system was conducted by other research team.

Figure 4:
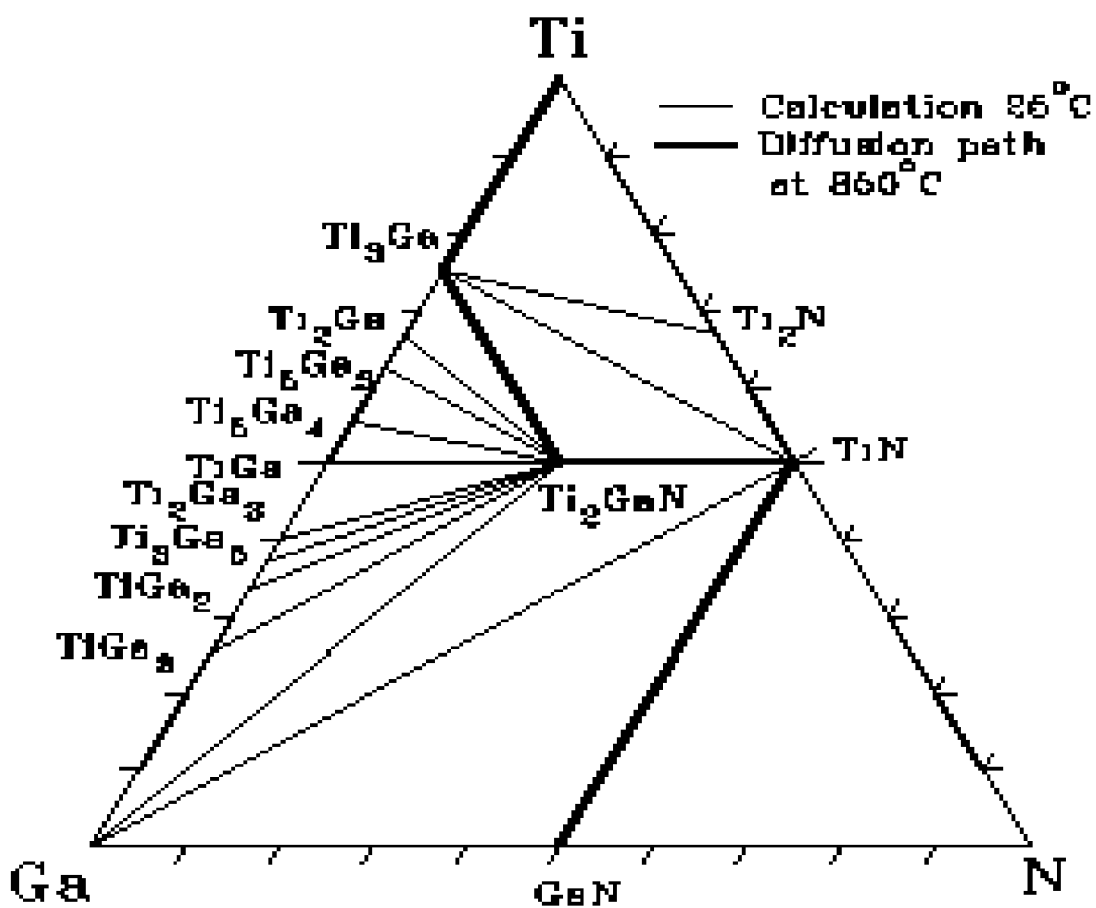
FIG. 4 shows an isothermal section of the Ti—Ga—N system at room temperature, approximately calculated with partly estimated thermodynamic values. The observed diffusion path in diffusion couples, annealed at 850° C., is superimposed.

FIG. 4 shows isothermal section of the Ti—Ga—N system at room temperature, approximately calculated with partly estimated thermodynamic values. The observed diffusion path in diffusion couples, annealed at 850° C., is superimposed. From FIG. 4, it has been found that the reaction between Ti and GaN is possible at a temperature of around 850° C. (annealing temperature). This means (Ti, Ga)N ternary alloy layer including Ti$_2$GaN phase can be confirmed. The result of this investigation using Ti/GaN diffusion cell has a good agreement with the present invention.

To form the second buffer layer 58 with a thickness of 50 Å to 100 Å, Ti precursor from metal-organic source as well as TiCl$_4$ gas, Trimethyl-Gallium (TMG) and ammonia (NH$_3$) are fed onto the substrate in the reactor having a pressure of 100 ton to 500 ton. The third buffer layer 59 is made of GaN. This layer, typically, is grown at a low temperature of about 530° C. to 600° C., most particularly, around 580° C.

Figure 5:
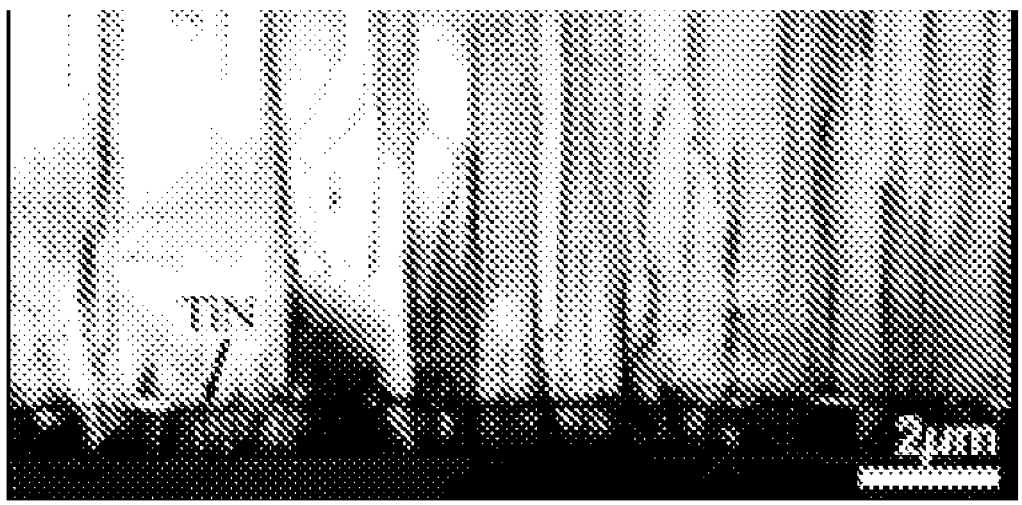
FIG. 5(A) is a cross sectional TEM image showing the effect of TiN inter-layer on GaN dislocation reduction.
FIG. 5(B) is a cross sectional TEM image showing GaN dislocation without a TiN inter-layer.
Figure 5:
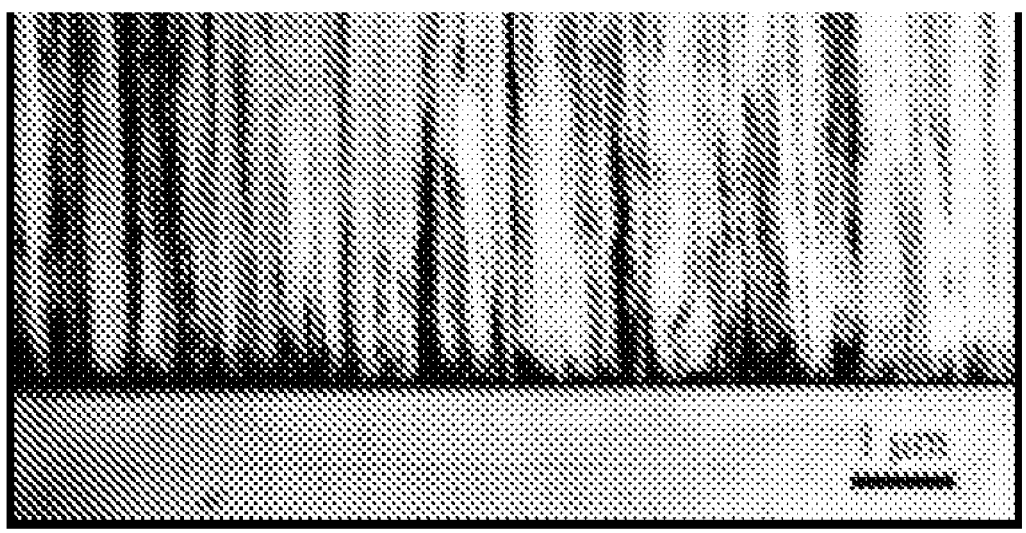

Processes for obtaining this kind of low temperature single buffer layer are already well known. Accordingly, the third buffer layer 59 in embodiments of the present invention is similar to a low-temperature GaN buffer layer from well-known processes or processes that may be developed. The third buffer layer 59 has a thickness of about 200 Å to about 300 Å. According to this embodiment, the new layer such as the first buffer layer 57, the second buffer layer 58 including TiN material between the substrate 47, and the third buffer layer 59 can play a significant role in reducing dislocations due to hetero-epitaxial structure growth. Therefore, overall group III nitride semiconductor LED-device quality can be improved by using new inter-layer with TiN compound. FIG. 5(A) is a cross sectional TEM image showing the effect of TiN layer on GaN dislocation reduction, and FIG. 5(B) is a cross sectional TEM image showing a GaN layer without a TiN layer.

The group III nitride compound semiconductor layer 67 can be a light-emitting device or a light detector-receptor. The layer 67 preferably comprise p type GaN layer, n type GaN layer, and an active layer interposed between the p type GaN layer and n type GaN layer.

Using a method of forming (and an apparatus for forming) a buffer layer on a substrate, particularly a semiconductor substrate or substrate assembly, using a vapor deposition process and one or more precursor compounds that include titanium ligands from the present invention, the group III nitride compound semiconductor device with a superior quality may be achievable.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a group III nitride compound semiconductor device comprising a substrate, buffer layers disposed on the substrate, and a group III nitride compound semiconductor layer disposed on the top layer of the buffer layers, the method comprising:
forming a first buffer layer on the substrate, the first buffer layer comprising a transition metal nitride; and
forming a second buffer layer on the first buffer layer, the second buffer layer comprising a nitride of gallium and a transition metal.

2. The method of claim 1, wherein the transition metal comprises at least one element selected from the group consisting of titanium, zirconium, hafnium, and tantalum.

3. The method of claim 1, further comprising forming a third buffer layer on the second buffer layer, the third buffer layer being interposed between the second buffer layer and the group III nitride compound semiconductor layer, wherein the third buffer layer comprises GaN.

4. The method of claim 1, wherein the first buffer layer comprises TiN, and the second buffer comprises (Ti, Ga)N.

5. The method of claim 1, wherein the first buffer layer comprises a TiN layer formed from a metal-organic titanium source selected from tetrakis-diethylamino-titanium (TDEAT), tetrakis-dimethylamino-titanium (TDMAT), titanium isopropoxide (TTIP), and titanium tetrachloride ($TiCl_4$).

6. The method of claim 1, wherein the second buffer layer comprises a (Ti, Ga)N layer formed from a metal-organic titanium source selected from tetrakis-diethylamino-titanium (TDEAT), tetrakis-dimethylamino-titanium (TDMAT), titanium isopropoxide (TTIP), and titanium tetrachloride ($TiCl_4$).

7. The method of claim 1, wherein the substrate comprises a material selected from the group of sapphire, silicon carbide, gallium nitride, gallium phosphide, and gallium arsenide.

8. The method of claim 3, wherein the first buffer layer has a thickness ranging from 20 Å to 100 Å, the second buffer layer has a thickness ranging from 50 Å to 100 Å, and the third buffer layer has a thickness ranging from 200 Å to 300 Å.

9. The method of claim 4, wherein the (Ti, Ga)N comprises a $Ti_2GaN$ phase.

10. A method of manufacturing a group III nitride compound semiconductor device comprising a substrate, buffer layers disposed on the substrate, and a group III nitride compound semiconductor layer disposed on the top layer of the buffer layers, the method comprising:
forming a first buffer layer on the substrate, the first buffer layer comprising a transition metal nitride;
forming a second buffer layer on the first buffer layer, the second buffer layer comprising a nitride of gallium and a transition metal; and
forming a third buffer layer comprising GaN, the third buffer layer being interposed between the second buffer layer and the group III nitride compound semiconductor layer,
wherein the transition metal comprises at least one element selected from the group consisting of titanium, zirconium, hafnium, and tantalum.

11. The method of claim 10, wherein the first buffer layer has a thickness ranging from 20 Å to 100 Å, the second buffer layer has a thickness ranging 50 Å from 100 Å, and the third buffer layer has a thickness ranging from 200 Å to 300 Å.

12. The method of claim 10, wherein the first buffer layer comprises TiN, and the second buffer layer comprises (Ti, Ga)N.

13. The method of claim 10, wherein the first buffer layer comprises a TiN layer formed from a metal-organic titanium source selected from tetrakis-diethylamino-titanium (TDEAT), tetrakis-dimethylamino-titanium (TDMAT), titanium isopropoxide (TTIP), and titanium tetrachloride ($TiCl_4$).

14. The method of claim 10, wherein the second buffer layer comprises a (Ti, Ga)N layer formed from a metal-organic titanium source selected from tetrakis-diethylamino-titanium (TDEAT), tetrakis-dimethylamino-titanium (TDMAT), titanium isopropoxide (TTIP), and titanium tetrachloride ($TiCl_4$).

15. The method of claim 10, wherein the substrate comprises a material selected from the group of sapphire, silicon carbide, gallium nitride, gallium phosphide, and gallium arsenide.

16. The method of claim 10, wherein the substrate has a hexagonal crystal structure.

17. The method of claim 12, wherein the (Ti, Ga)N comprises a $Ti_2GaN$ phase.

* * * * *